United States Patent [19]
Bailey et al.

[11] Patent Number: 6,043,715
[45] Date of Patent: Mar. 28, 2000

[54] PHASE-LOCKED LOOP WITH STATIC PHASE OFFSET COMPENSATION

[75] Inventors: James A. Bailey, Snowflake, Ariz.; Angelo R. Mastrocola, West Lawn, Pa.; Jeffrey L. Sonntag, Allentown, Pa.; William B. Wilson, Macungie, Pa.

[73] Assignee: Lucent Technologies Inc., Murray Hill, N.J.

[21] Appl. No.: 09/144,916

[22] Filed: Sep. 1, 1998

Related U.S. Application Data

[60] Provisional application No. 60/057,875, Sep. 2, 1997.

[51] Int. Cl.[7] ............................... G09F 13/26
[52] U.S. Cl. ........................ 331/2; 331/17; 327/156; 327/157
[58] Field of Search .................... 331/2, 10, 11, 331/17; 327/156, 157

[56] References Cited

U.S. PATENT DOCUMENTS 5,838,205  11/1998  Ferriaolo et al. ................. 331/2

OTHER PUBLICATIONS

"A Self Correcting Clock Recovery Circuit," by Charles R. Hogge, Jr., IEEE Journal of Lightwave Technology, vol. LT–3, Dec. 1985, pp. 1312–1314.

*Primary Examiner*—Robert Pascal
*Assistant Examiner*—Kimberly Glenn

[57] ABSTRACT

A phase-locked loop (PLL) has a master circuit configured to a slave circuit. The slave circuit has a phase detector, a charge pump, a loop filter, and a voltage-controlled oscillator configured to operate as a closed-loop PLL. The master circuit has a phase detector and a charge pump that are similar to the corresponding components in the slave circuit. The master circuit is configured to receive two input signals with zero phase offset. As such, any net current charge generated by the master charge pump will be indicative of mismatch within the master phase detector and charge pump, and therefore, by analogy, indicative of mismatch within the slave phase detector and charge pump, as well. A voltage signal generated by the master circuit is applied to control the generation of currents by the slave charge pump in such a way as to compensate for static phase offset that would otherwise exist in the slave circuit.

12 Claims, 3 Drawing Sheets

PHASE-LOCKED LOOP WITH STATIC PHASE OFFSET COMPENSATION

CROSS-REFERENCE TO RELATED APPLICATIONS

This application claims the benefit of the filing date of U.S. provisional application No. 60/057,875, filed on Sep. 2, 1997 as attorney docket no. Bailey 2-6-18-4.

BACKGROUND OF THE INVENTION

1. Field of the Invention

The present invention relates to electronics, and, in particular, to phase-locked loops.

2. Description of the Related Art

A phase-locked loop (PLL) is a circuit that generates a periodic output signal phase-locked to an input signal. PLLs are widely used in many types of measurement, microprocessor, and communication applications. One type of phase-locked loop is the charge-pump PLL, which is described in Floyd M. Gardner, "Charge-Pump Phase-Lock Loops" *IEEE Trans. Commun.*, vol. COM-28, pp. 1849–1858, November 1980, the teachings of which are incorporated herein by reference.

FIG. 1 shows a block diagram of a charge-pump phase-locked loop 100. Phase detector (PD) 102 compares the phase $\theta_R$ of its input signal $F_R$, to the phase $\theta_V$ of the feedback signal $F_V$ and generates an error signal: either an up signal U (when $\theta^R$ leads $\theta_V$) or a down signal D (when $\theta_V$ leads $\theta_R$), where the width of the error signal pulse indicates the magnitude of the difference between $\theta_R$ and $\theta_V$.

Charge pump 104 generates an amount of charge equivalent to the error signal (either U or D) from PD 102. Depending on whether the error signal was an up signal or a down signal, the charge is either added to or subtracted from the capacitors in loop filter 106. For purposes of this explanation, loop filter 106 has a relatively simple design, consisting of a capacitor $C_S$ in parallel with the series combination of a resistor R and a relatively large capacitor $C_L$. Other, more-sophisticated loop filters are of course also possible. The resulting loop-filter voltage $V_{LF}$ is applied to voltage-controlled oscillator (VCO) 108. A voltage-controlled oscillator is a device that generates a periodic output signal ($F_{OUT}$ in FIG. 1), whose frequency is a function of the VCO input voltage ($V_{LF}$ in FIG. 1). In addition to being the output signal from PLL 100, the VCO output signal $F_{OUT}$ is used as the feedback signal for the closed-loop PLL circuit.

Optional input and feedback dividers 110 and 112 may be placed in the input and feedback paths, respectively, if the frequency of the output signal $F_{OUT}$ is to be either a fraction or a multiple of the frequency of the input signal $F_{IN}$. If not, the input and feedback dividers can both be considered to apply factors of 1 to the input and feedback signals, respectively.

Due to the effect of the feedback path in PLL 100, the steady-state output signal $F_{OUT}$ will be phase-locked to the input signal $F_{IN}$. Under ideal conditions, unless some phase offset is purposely added, the phases of the input signals $F_R$ and $F_V$ to PD 102 of PLL 100 will be synchronized with zero offset. In reality, however, a phase-locked loop, such as PLL 100 of FIG. 1, will operate with some non-zero phase offset. One possible cause for such phase offset is a mismatch between the UP and DOWN currents generated by charge pump 104. Other causes may be due to other mismatches within either the phase detector or the charge pump, or both.

In the presence of an UP/DOWN current mismatch, the PLL feedback loop has to put a phase offset between the two inputs to PD 102 to generate UP/DOWN pulses that balance the mismatch in order to achieve a phase-locked condition. Under constant operating conditions (e.g., temperature and clock cycle), this particular type of phase offset is itself typically constant and is therefore referred to as static phase offset.

Since PLLs are widely used in clock distribution applications, avoidance of a phase difference between the input reference system clock and the PLL-generated output clock is desired. Any phase difference degrades system performance and can be catastrophic, especially at higher frequencies, where the period of the PLL's input and output signals are smaller, leaving very limited leeway between edges of the input and output signals.

SUMMARY OF THE INVENTION

The present invention is directed to a scheme for compensating for static phase offset in a phase-locked loop. According to this scheme, a PLL has a master circuit and a slave circuit, where the slave circuit is similar to a conventional PLL, and the master circuit generates a control voltage signal used to control the charge pump in the slave circuit. The master circuit has a phase detector and a charge pump that are purposely similar to the PD and charge pump in the slave circuit. By applying inputs having zero phase offset to the master circuit, the master circuit simulates the mismatch between devices in the slave circuit. The resulting control voltage signal is applied to the charge pump in the slave circuit in such a way as to compensate for similar static phase offset in the slave circuit.

In one embodiment, the present invention is an integrated circuit having a phase-locked loop, the PLL comprising a first master circuit configured to a slave circuit. The first master circuit comprises one or more components similar to corresponding components in the slave circuit and the first master circuit is adapted to receive input signals with substantially zero phase offset to generate a control signal representative of mismatch within the components. The control signal is applied to the slave circuit to compensate for similar static phase offset in the slave circuit.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
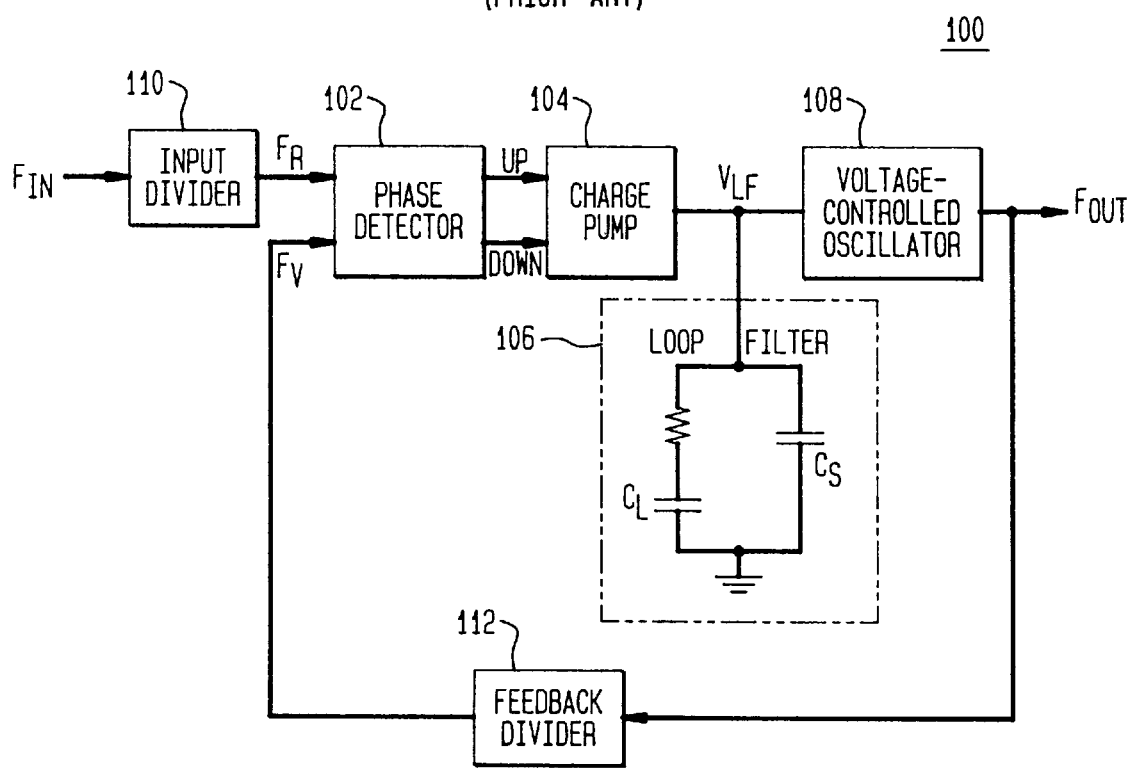
FIG. 1 shows a block diagram of a conventional charge-pump phase-locked loop.
Figure 2:
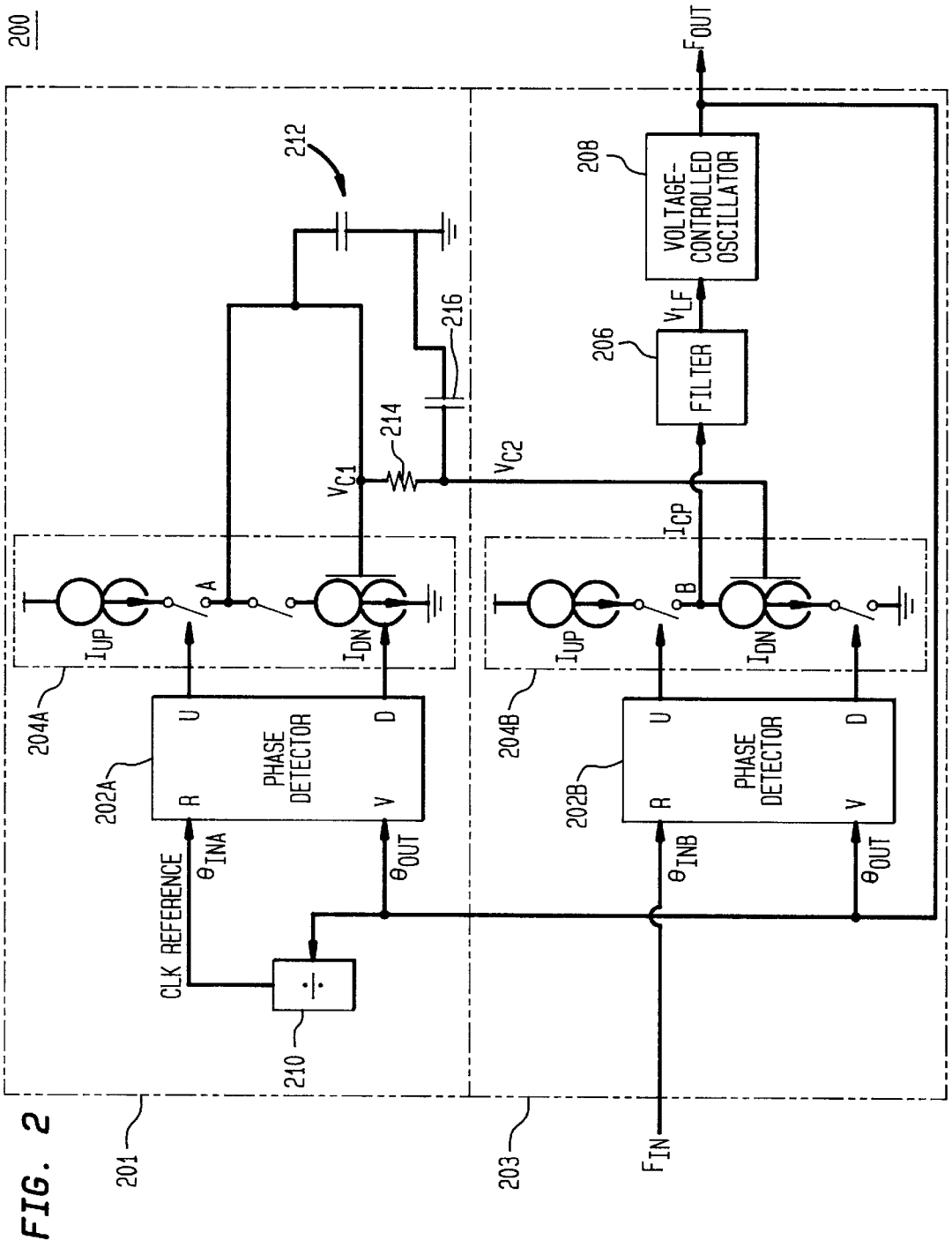
FIGS. 2 and 3 show block diagrams of phase-locked loops, according to different embodiments of the present invention.

FIG. 2 shows a block diagram of phase-locked loop 200, according to one embodiment of the present invention. PLL 200 has a master circuit 201 and a slave circuit 203. Slave circuit 203 comprises phase detector 202B, charge pump 204B, filter 206, and voltage-controlled oscillator 208. These components are similar to those of PLL 100 of FIG 1.

In particular, phase detector 202B of slave circuit 203 receives an input signal $F_{IN}$ (e.g., the data input for PLL 200) and a feedback signal $F_{OUT}$, compares the phase $\theta_{INB}$ of the input signal $F_{IN}$ to the phase $\theta^{OUT}$ of the output signal $F_{OUT}$, and, depending on which signal leads the other, generates either an UP pulse or a DOWN pulse signal for charge pump 204B, where the magnitude of the pulse is a function of the magnitude of the phase difference between the two signals. In reality, PD 202B generates both an UP pulse and a DOWN pulse, with the difference in duration between the two pulses being a function of the phase difference of the two inputs to PD 202B.

Depending on whether the UP pulse or the DOWN pulse has a longer duration, charge pump 204B generates a current $I_{CP}$ that is either positive or negative. As shown in FIG. 2, charge pump 204B is implemented with a device that generates an UP current $I_{UP}$ having a fixed magnitude and a device that generates a DOWN current $I_{DN}$ whose magnitude is a function of the voltage applied to its gate. When PD 202B generates an UP pulse, the switch at the UP current source in charge pump 204B closes for the duration of the UP pulse, causing the UP current $I_{UP}$ to be applied to node B, thereby applying positive charge to filter 206 in the form of a positive charge-pump current $I_{CP}$. When PD 202B generates a DOWN pulse, the switch at the DOWN current source in charge pump 204B closes for the duration of the DOWN pulse, causing the DOWN current $I_{DN}$ to be applied to node B, thereby removing charge from filter 206 in the form of a negative charge-pump current $I_{CP}$.

The UP and DOWN current sources in charge pump 204B may be implemented with any suitable devices. For example, using CMOS technology, the UP current source can be implemented using p-channel FETs, while the DOWN current source can be implemented using n-channel FETs. In alternative implementations, the current sources can be implemented using bipolar transistor technology, in which case, the control element of each transistor is referred to as the base, rather than as the gate.

Like filter 106 of FIG. 1, loop filter 206 accumulates the net current charges generated by charge pump 204B and generates a loop-filter voltage $V_{LF}$ that controls the frequency of the output signal $F_{OUT}$ generated by VCO 208, which is also the feedback signal applied to PD 202B.

Master circuit 201 comprises reference generator 210, phase detector 202A, charge pump 204A, and a filter, which, in this embodiment, consists of capacitors 212 and 216 and resistor 214. Master circuit 201 is purposely implemented with some of its components as identical as possible to corresponding components in slave circuit 203. In particular, PD 202A of master circuit 201 is ideally the same as PD 202B of slave circuit 203, and the devices used to implement charge pump 204A of master circuit 201 are ideally the same as those used to implement charge pump 204B of slave circuit 203. The signals input to master PD 202A, however, are different from those input to slave PD 202B. The two inputs to master PD 202A are both based on the same signal (in this implementation, the feedback signal $F_{OUT}$), with the reference input (R) to master PD 202A being generated by reference generator 210, which in this implementation is a divider. Those skilled in the art will understand that reference generator 210 is implemented as a divider to ensure that the reference input R to master PD 202A is NRZ (no return to zero) data for those phase detectors expecting NRZ data. Other phase detectors that expect different (i.e., non-NRZ) reference inputs may require a different reference generator (e.g., simply a wire in some cases).

By generating both input signals to master PD 202A from the same signal (in this case, feedback signal $F_{OUT}$, although other signals could be used, such as an externally generated clock signal), the two input signals are guaranteed to be in phase (i.e., zero phase offset between them) (assuming that no phase delay is introduced by reference generator 210). This zero phase offset condition ensures that any net charge accumulating on capacitors 212 and 216 based on currents generated by master charge pump 204A will be due solely to mismatches within master PD 202A and charge pump 204A. Since those components are ideally the same as the corresponding components in slave circuit 203, the mismatch in master circuit 201 should mirror the mismatch in slave circuit 203.

As shown in FIG. 2, any net charges accumulating on capacitors 212 and 216 will result in a control voltage $V_{C1}$ which is applied to the gate of the DOWN current source in master charge pump 204A and a control voltage $V_{C2}$ which is applied to the gate of the DOWN current source in slave charge pump 204B. The effect is to control the magnitudes of the DOWN currents $I_{DN}$ in both master charge pump 204A and slave charge pump 204B based on the control voltages $V_{C1}$ and $V_{C2}$, respectively, generated by master circuit 201.

If master PD 202A and charge pump 204A operate substantially identically to slave PD 202B and charge pump 204B, respectively, then the mismatch in master circuit 201 should be substantially identical to the mismatch in slave circuit 203. A mismatch in master circuit 201 that results in a net positive current being generated by master charge pump 204A will result in a net positive charge being stored in capacitors 212 and 216 and control voltages $V_{C1}$ and $V_{C2}$ being increased. These increases in control voltages $V_{C1}$ and $V_{C2}$, as applied to the gates of the DOWN current sources in master charge pump 204A and slave charge pump 204B, respectively, will increase the magnitudes of the DOWN currents $I_{DN}$, thereby tending to compensate for the positive-current mismatch.

Analogously, a mismatch in master circuit 201 that results in a net negative current being generated by master charge pump 204A will result in a net negative charge being stored in capacitors 212 and 216 and control voltages $V_{C1}$ and $V_{C2}$ being decreased. These decreases in control voltages $V_{C1}$ and $V_{C2}$, as applied to the gates of the DOWN current sources in master charge pump 204A and slave charge pump 204B, respectively, will decrease the magnitudes of the DOWN currents $I_{DN}$, thereby tending to compensate for the negative-current mismatch.

In this way, controlling the magnitudes of the DOWN currents $I_{DN}$ decreases the magnitude of net charge that would otherwise accumulate on the capacitors in filter 206 due to mismatches within slave PD 202B and charge pump 204B. Assuming complete negation of such charge build-up in filter 206, the phase $\theta^{OUT}$ of the feedback signal $F_{OUT}$ would be able to match the phase $\theta_{INB}$ of the input signal $F_{IN}$, thus achieving a phase-locked condition with zero static phase offset. In this way, the present invention provides a scheme for compensating for—and possible canceling—static phase offset in PLLs.

Although the present invention has been described in the context of charge pumps having UP currents with fixed magnitudes and DOWN currents with controlled magnitudes, it will be understood that the present invention can be implemented using alternative schemes, such as charge pumps having fixed DOWN currents and controlled UP currents or charge pumps in which both UP and DOWN currents are controlled.

Figure 3:
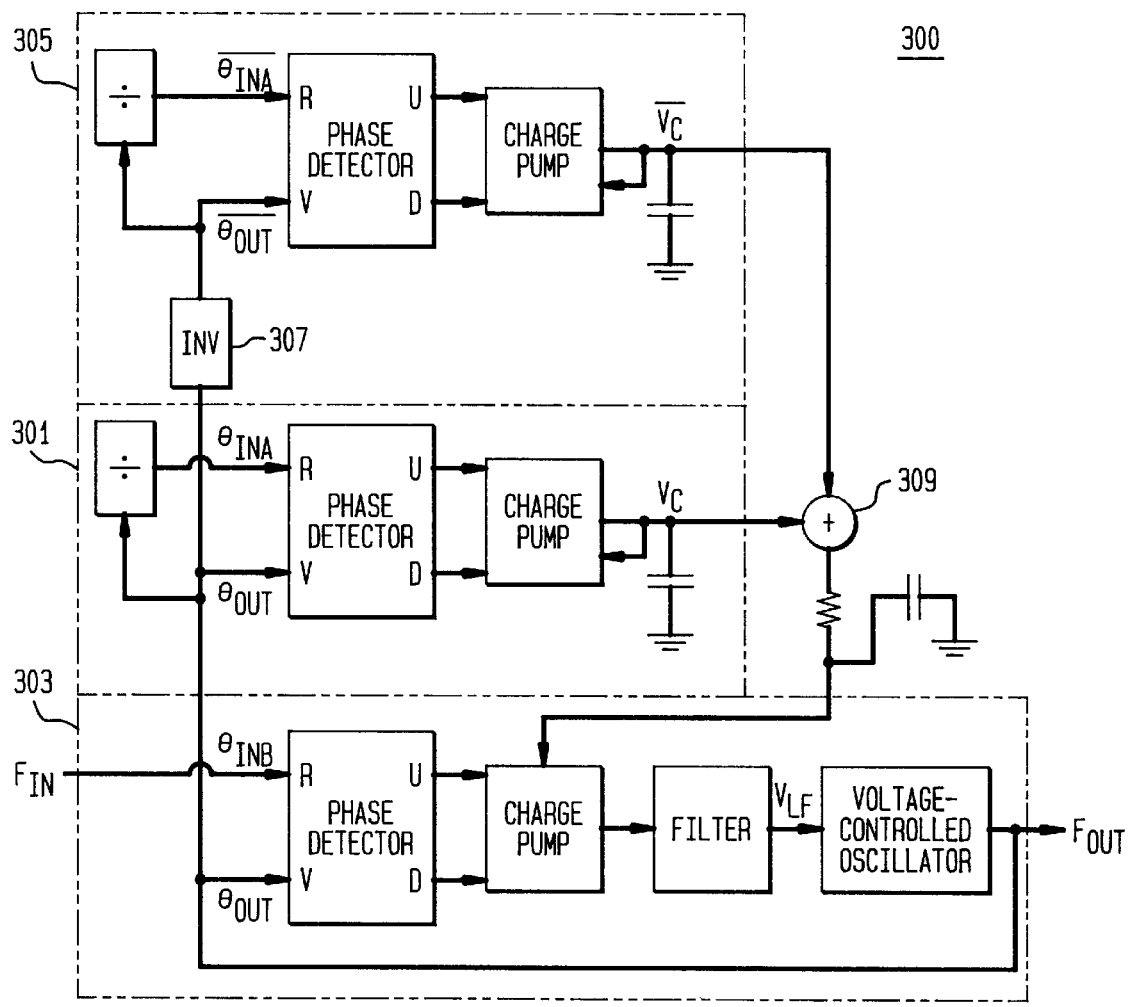

FIG. 3 shows a block diagram of phase-locked loop 300, according to another alternative embodiment of the present invention. In applications using both output clock edges, output clock duty cycle affects phasing of positive vs. negative clock edges. Also, if the phase detector is sensitive to signal duty cycle, FIG. 3 may be used to weight phase adjustments for positive vs. negative clock edges. PLL 300 has two master circuits 301 and 305 and a slave circuit 303. Master circuit 301 and slave circuit 303 are similar to master circuit 201 and slave circuit 203, respectively, of PLL 200 of FIG. 2. Master circuit 305 is similar to master circuit 301, except that it has an inverter 307 that inverts the feedback signal $F_{OUT}$ generated by the VCO of slave circuit 303. In addition, PLL 300 has a summation node 309 which generates the weighted sum (e.g., average) of the two voltages $V_C$ and $\overline{V_C}$ generated by the two master circuits 301 and 305. This weighted sum is used to generate the control voltage applied to the charge pump in slave circuit 303. By generating the control voltage based on the weighted sum of voltage signals generated based on the feedback signal $F_{OUT}$ and its inverse $\overline{F_{OUT}}$, the static phase offset compensation scheme of PLL 300 accounts for variations in the duty cycle of the signals used to generate the control voltage signal.

Those skilled in the art will understand that the phase detectors of the present invention may be implemented as phase/frequency detectors. Furthermore, although the present invention has been described in the context of PLLs having a slave circuit and at least one distinct master circuit, those skilled in the art will understand that the present invention can be implemented in embodiments having a single circuit similar to the on-line slave circuit in FIGS. 2 and 3, where, at different times, the circuit may be switched off-line to operate as an off-line master circuit used to generate signals for compensating for static phase offset when the circuit operates as an on-line slave circuit. Such an implementation would make use of well-known techniques related to the timing of calibrations in D/A and A/D converters.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a phase-locked loop (PLL), the PLL comprising a first master circuit connected to a slave circuit, wherein the first master circuit comprises one or more components similar to corresponding components in the slave circuit and the first master circuit is adapted to receive input signals with substantially zero phase offset to generate a control signal representative of mismatch within the components, wherein the control signal is applied to the slave circuit to compensate for static phase offset in the slave circuit.

2. The invention of claim 1, wherein:
   the slave circuit comprises:
   (a) a slave phase detector, configured to receive an input signal and a feedback signal and to generate UP and DOWN pulses based on differences in phase between the input and feedback signals;
   (b) a slave charge pump, configured to receive the UP and DOWN pulses from the slave phase detector and to generate a slave charge-pump current based on the UP and DOWN pulses;
   (c) a loop filter, configured to receive the slave charge-pump current and to generate a loop-filter voltage from the slave charge-pump current; and
   (d) a voltage-controlled oscillator, configured to receive the loop-filter voltage and to generate an output signal whose frequency is based on the loop-filter voltage, wherein the feedback signal is generated from the output signal; and
   the first master circuit comprises:
   (A) a master phase detector, configured to receive two input signals having substantially zero phase offset and to generate UP and DOWN pulses indicative of any mismatch within the master phase detector; and
   (B) a master charge pump, configured to receive the UP and DOWN pulses from the master phase detector and to generate a master charge-pump current based on the UP and DOWN pulses and further indicative of any mismatch within the master charge pump, wherein the master charge-pump current is used to generate the control signal applied to the slave circuit.

3. The invention of claim 2, wherein the two input signals to the master phase detector are generated from the feedback signal generated by the slave circuit.

4. The invention of claim 3, wherein the master circuit comprises a reference generator that ensures that the master phase detector receives an appropriate reference input signal.

5. The invention of claim 2, wherein the control signal is applied to the slave charge pump to control the magnitude of the slave charge-pump current.

6. The invention of claim 2, wherein the slave charge pump comprises an UP current source configured to generate an UP current and a DOWN current source configured to generate a DOWN current, and the control signal is applied to at least one of the UP and DOWN current sources to control the magnitude of at least one of the UP and DOWN currents.

7. The invention of claim 6, wherein the UP current source is a substantially constant current source and the control signal is applied to the DOWN current source to control the magnitude of the DOWN current.

8. The invention of claim 7, wherein the UP and DOWN current sources are transistor devices and the control signal is applied to a control element of the DOWN current source.

9. The invention of claim 6, wherein the DOWN current source is a substantially constant current source and the control signal is applied to the UP current source to control the magnitude of the UP current.

10. The invention of claim 9, wherein the UP and DOWN current sources are transistor devices and the control signal is applied to a control element of the UP current source.

11. The invention of claim 1, wherein the PLL further comprises a second master circuit, adapted to generate a control signal based on inverted versions of the input signals applied to the first master circuit, wherein the control signals from the first and second master circuits are combined to generate the control signal applied to the slave circuit.

12. The invention of claim 1, wherein the master circuit and the slave circuit are implemented as a single circuit that operates as the slave circuit when switched on-line and operates as the master circuit when switched off-line.

* * * * *